United States Patent [19]

Parrini

[11] Patent Number: 4,460,272

[45] Date of Patent: Jul. 17, 1984

[54] PRINTING MACHINES USED IN PHOTOLITHOGRAPHY, REPRO WORK, SCREEN PRINTING, AND BROMOGRAPHY

[75] Inventor: Carlo G. Parrini, Segrate, Italy

[73] Assignee: Repro Master Electronic S.R.L., Milan, Italy

[21] Appl. No.: 377,605

[22] Filed: May 13, 1982

[30] Foreign Application Priority Data

Jun. 3, 1981 [IT] Italy .............................. 21966/81[U]

[51] Int. Cl.³ ............................................ G03B 27/20
[52] U.S. Cl. ........................................ 355/91; 355/76
[58] Field of Search .................................. 355/91–94, 355/76, 73

[56] References Cited

U.S. PATENT DOCUMENTS 3,507,593  4/1970  McTeague ...................... 355/91 X
3,751,250  8/1973  Moscony et al. ................ 355/91 X Primary Examiner—Richard A. Wintercorn
Attorney, Agent, or Firm—Gottlieb, Rackman & Reisman

[57] ABSTRACT

An improvement in printing machines used in photolithography, repro work, screen printing, and bromography having a glass plate and a vacuum table between which, for example, a film containing the drawing to be reproduced and the plate to be engraved are laid, after which the air between the superimposed plates is sucked out by means of a vacuum pump, characterized by the fact that the underside of the glass plate has a finely-grained rough surface, across which the air is able to escape on all sides.

2 Claims, 2 Drawing Figures

PRINTING MACHINES USED IN PHOTOLITHOGRAPHY, REPRO WORK, SCREEN PRINTING, AND BROMOGRAPHY

The printing machines used in photolithography, repro work, screen printing, and bromography employ a glass plate and vacuum table, between which, for example, a film containing the drawing to be reproduced and the plate to be engraved are laid. In principle, due to the vacuum created on the vacuum table, the air is sucked out from between the three plates laid on top of each other—the glass plate, the film, and the engraving plate—so that the plates lie absolutely flat on each other, without any air in between. In practice, however, small air-bubbles remain between the glass plate and the film underneath it, and these form so-called Newton rings, which give rise to engraving defects in the engraved plate. This means that the attempt has to be made to remove the Newton rings by repeated switching on of the vacuum pump, which, however, is not always successful and, in any case, wastes a lot of time.

Accordingly, it is the general purpose of the present invention to provide an improved printing machine of the type used in photolithography, repro work, screen printing and bromography.

A more specific object of the present invention is to provide a printing machine of the type used in photolithography, repro work, screen printing, and bromography which permits production of improved quality engraving plates by elimination of Newton ring defects.

These and other objects of the present invention are obtained by providing a printing machine of the type used in photolithography, repro work, screen printing, and bromography including a vacuum table having a vacuum pump, and a glass covering plate. An engraving plate and film are positioned on the vacuum table and arranged such that the glass covering plate overlies the engraving plate and film in superimposed relation. The vacuum pump provides a pressure source for removal of air bubbles between the superimposed plates. In accordance with the present invention bubbles between the glass plate and film which give rise to Newton Ring defects are eliminated by providing the underside of the glass covering plate with a very finely-grained rough surface, whose grain measures a few hundredths of a millimeter. Experience has shown that: firstly, with the aforementioned finely-grained rough surface, all the air is immediately expelled from between the glass plate and the film, as soon as the vacuum is applied; and secondly that, surprisingly enough, the rough surface of the glass plate does not adversely affect the sharpness of the picture to be engraved. Advantageously, a glass plate in accordance with the invention having a finely grained rough surface may be incorporated into conventional printing machines.

Other objects, aspects, and advantages of the present invention will be apparent when the detailed description of the preferred embodiment of the invention is considered in conjunction with the drawings, which should be construed in an illustrative and not limiting sense, as follows.

Figure 1:
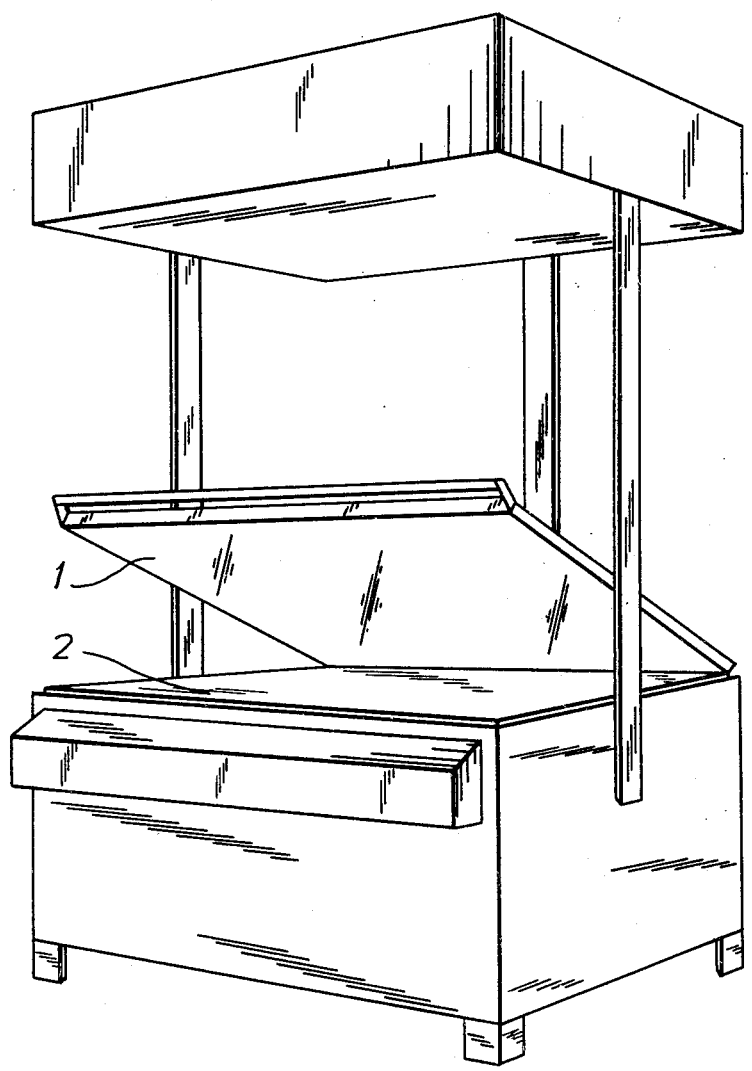
FIG. 1 is a perspective view of a bromograph employing a glass plate according to the invention.

Referring now to the drawings, FIG. 1 illustrates a glass plate 1 and a vacuum table 2, under which a vacuum pump is located. The plate to be engraved and, on top of it, the film of the picture to be reproduced are placed on the table 2. The glass plate 1 is then lowered onto them in such a way that the plates and the film are lying on top of each other, after which the vacuum pump is switched on, in order to suck the air out from between the superimposed plates. The absence of air between the glass plate 1 and the film underneath it is ensured by the fact that, due to the rough surface of the glass plate 1, the air is able to escape on all sides, and thus no Newton rings are formed between the glass plate and the film.

Figure 2:
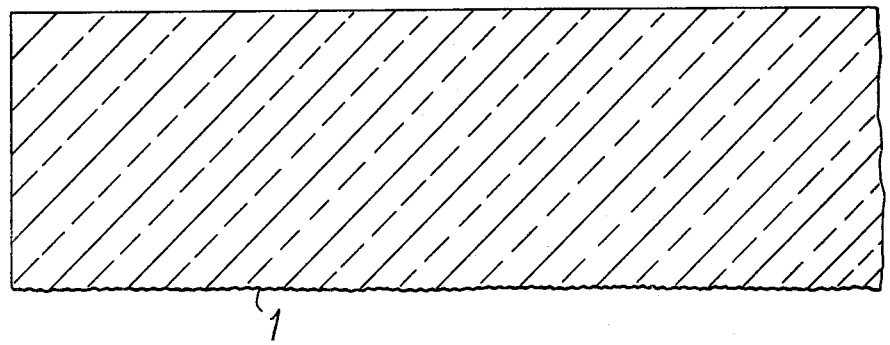
FIG. 2 is an enlarged, partial, transverse cross-sectional view of the glass plate of FIG. 1 showing the finely grained rough undersurface of the plate.

The glass plate 1, best shown in FIG. 2, preferably has a thickness of approximately 5 mm. The depth and spacing of the roughness produced on the undersurface of the plate is preferably in the range of a few hundreths of a millimeter, for example, 0.01 to 0.05 mm, which is not visible with the naked eye. The rough surface on the underside of the glass plate 1 can be produced either chemically or by sandblasting, by well-known methods.

It should be understood that the above-described embodiment of the invention is merely illustrative and other embodiments may be devised by those skilled in the art, without departing from the spirit or scope of the present invention, as set forth in the appended claims.

What is claimed is:

1. An improvement in printing machines used in photolithography, repro work, screen printing, and bromography having a glass plate and a vacuum table between which, for example, a film containing the drawing to be reproduced and the plate to be engraved are laid, after which the air between the superimposed plates is sucked out by means of a vacuum pump, in which the glass plate is treated to allow perfect evacuation of air from the adhering surfaces of the glass plate and the underlying film, characterized by the fact that said treatment is consisting of a finely grained rough surface extending over the entire underside of the glass plate, so that the surfaces of the glass plate and film can perfectly adhere with one another over their entire extensions.

2. An improvement in accordance with claim 1, characterized by the fact that the grain of the rough surface of the underside of the glass plate measures a few hundredths of a millimeter.

* * * * *